United States Patent [19]

Taylor

[11] 4,353,032
[45] Oct. 5, 1982

[54] GLITCH DETECTOR

[75] Inventor: Keith A. Taylor, Portland, Oreg.

[73] Assignee: Tektronix, Inc., Beaverton, Oreg.

[21] Appl. No.: 155,363

[22] Filed: Jun. 2, 1980

[51] Int. Cl.³ .................... H03K 13/32; H03K 5/26
[52] U.S. Cl. ............................... 328/165; 328/111; 307/234; 307/520
[58] Field of Search ............ 328/109, 110, 111, 112, 328/165; 307/517, 234, 520

[56] References Cited

U.S. PATENT DOCUMENTS

| | | | |
|---|---|---|---|
| 3,555,434 | 1/1971 | Sheen | 328/109 |
| 3,727,142 | 4/1973 | De Sipio et al. | 328/111 |
| 3,821,563 | 6/1974 | Warren | 307/234 |
| 3,958,133 | 5/1976 | Albano et al. | 307/234 |
| 4,070,631 | 1/1978 | Nash et al. | 328/165 |
| 4,105,980 | 8/1978 | Cowardin et al. | 328/165 |
| 4,107,651 | 8/1978 | Martin | 371/6 |

*Primary Examiner*—John S. Heyman
*Attorney, Agent, or Firm*—George T. Noe

[57] ABSTRACT

A glitch detector for use in a sampled data acquisition system is disclosed. Glitch detection is provided by a flip-flop which is set on a first signal transition, conditioning a logic gate, the output of which changes logic states on a second signal transition. Two such glitch detectors operatively associated with complementary data signals permits detection of either positive-going or negative-going glitches within a sample clock period. A glitch indication flip-flop is reset by a glitch detection signal, providing a glitch indication signal to an output terminal via a latch. Control and reset circuits are provided to facilitate glitch detection on every cycle of the sample clock, and at any point within a sample clock period.

8 Claims, 2 Drawing Figures

GLITCH DETECTOR

BACKGROUND OF THE INVENTION

Logic analyzers have been developed to provide real-time analysis of digital electronic systems. Logic analyzers appear similar to oscilloscopes in that they display a plurality of digital signals on a cathode-ray tube screen; however, it is the combination of such signals at any given point in time that conveys digital information, or data words. The logic analyzer has a separate input and memory channel for each signal, and typically a plurality of channels are provided, depending upon the length of the data word, to simultaneously process and display parallel data bits. Each data channel samples the incoming digital signal at a rate determined by an internal reference clock, and since the digital signal is essentially a stream of pulses, the sampled signal will be either a high or a low value.

Occasionally, spurious or random narrow pulses or noise spikes may appear in a stream of data. These are called glitches, and may result in erroneous data acquisition, or undesired triggering, or false signals to be generated. Thus it is desirable to detect glitches which occur within a sample clock period so as to negate or correct errors which the glitch may have caused. Prior art glitch detector circuits are complex and have limitations, such as inability to detect glitches on every clock cycle and inability to detect second-order glitches (those with three transitions rather than two).

SUMMARY OF THE INVENTION

In accordance with the present invention, a circuit is provided for detecting either positive-going or negative-going glitches which occur anywhere within a sample clock period in a data analysis and display system. The glitch detector circuit is disposed substantially parallel with a clocked data latch in a data acquisition channel. The data latch stores the logic state of the input signal that exists at the time of the active clock edge. Depending upon the stored logic state, the data latch output disables one of a pair of complementary first RS flip-flops which are coupled to complementary data lines on the input side of the latch. If the state of the input signal changes from that stored by the latch, the enabled one of the pair of first RS flip-flops is set. Then if the input signal returns to the state stored by the latch, a second RS flip-flop is set, indicating the occurrence of a glitch. On the next active clock edge, the glitch indication signal is transferred to an output terminal. Reset circuitry is provided to reset the complementary pair of first RS flip-flops and the second RS flip-flop in such a manner that glitch detection may be provided on every cycle of the sample clock.

It is therefore one object of the present invention to provide a novel circuit for glitch detection in a digital analysis system.

It is another object of the present invention to provide a circuit capable of providing glitch detection on every cycle of an internal reference clock, and at any point within the reference clock period.

It is a further object of the present invention to provide a glitch detection circuit capable of detecting both first-order and second-order glitches.

Other objects and advantages will become apparent to those having ordinary skill in the art upon a reading of the following description when taken in conjunction with the accompanying drawings.

DETAILED DESCRIPTION OF THE INVENTION

Figure 1:
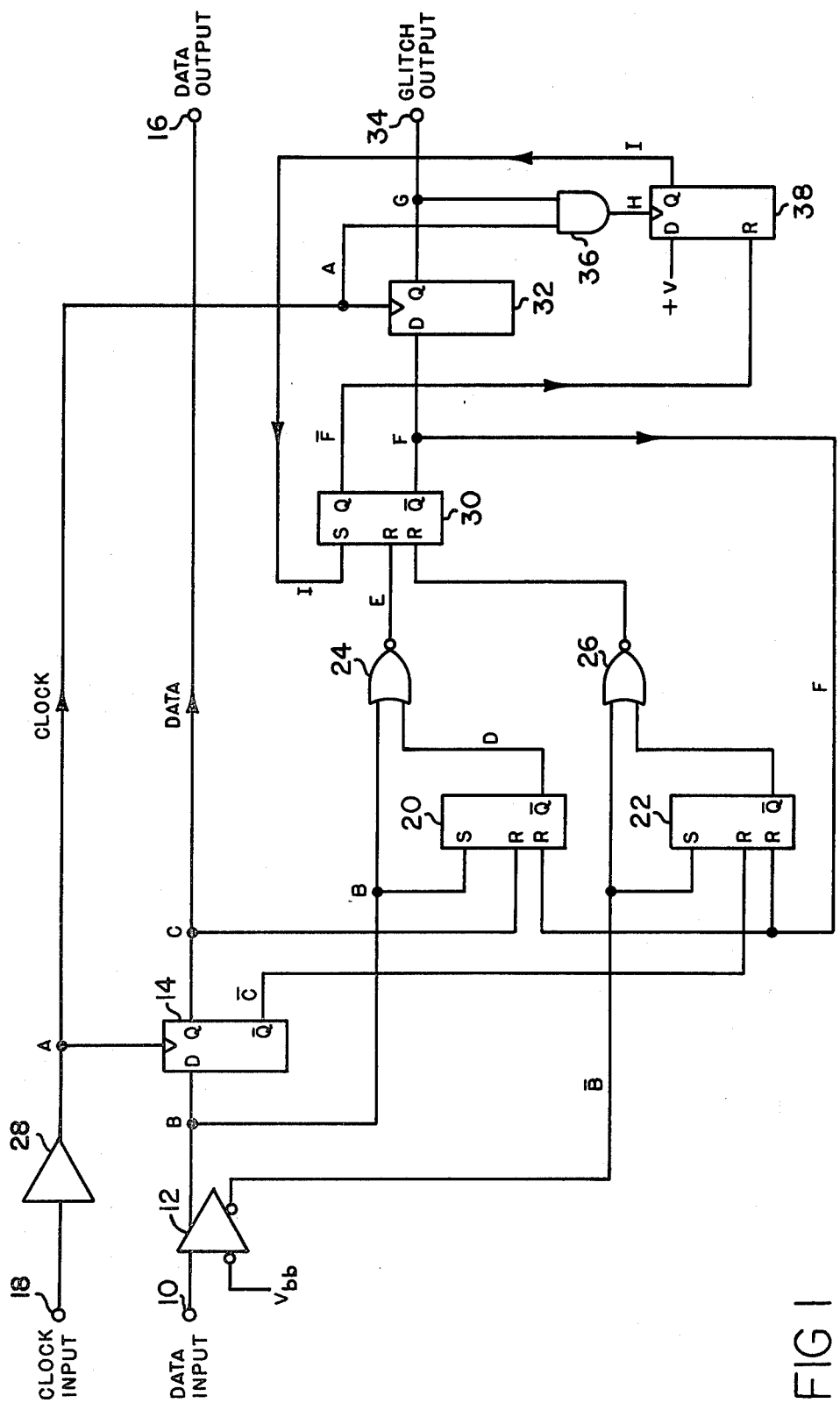
FIG. 1 is a schematic diagram of a glitch detection circuit in accordance with the present invention.

Referring to FIG. 1, there is shown a schematic diagram of a glitch detection circuit in accordance with the present invention. The components are shown using standard logic symbols, and are readily available as off-the-shelf commercial items. The entire circuit, however, lends itself to realization in monolithic integrated circuit form, particularly because in actual practice an electronic instrument, such as a logic analyzer, embodying the present invention will have several data channels like the one shown in FIG. 1. Since the function of the glitch detector is to detect the presence of signals having durations less than that of a sampling clock period, any implementation of the present invention should include very fast response logic circuitry.

A data channel comprises an input terminal 10, a differential amplifier 12 with complementary outputs, a D-type flip-flop 14 for data latching, and an output terminal 16. A clock signal is applied via a clock input terminal 18 and a buffer amplifier 28 to the clock input of data-latch flip-flop 14. The signal level (either a logic high or low) at the D input of flip-flop 14 is transferred to the Q output thereof on the active edge of the clock signal.

The glitch detection circuit comprises a pair of first R-S flip-flops 20 and 22, a pair of NOR gates 24 and 26, and a second R-S flip-flop 30. The set (S) inputs of flip-flops 20 and 22 are coupled to the respective complementary outputs of differential amplifier 12, while one of the two reset (R) inputs of R-S flip-flop 20 is connected to the $\overline{Q}$ output of the data latch flip-flop 14, and one of the two reset inputs of R-S flip-flop 22 is connected to the Q output of the data latch flip-flop 14. For the circuit shown, positive logic is employed, and therefore, the 1-state is a logic high and an activating pulse edge is positive-going. Thus, in the absence of a logic high at the S input, a logic high at the R input of either flip-flop 20 or 22 asserts a logic high at its $\overline{Q}$ output, forcing the output of associated NOR gate 24 or 26, respectively, low. A logic high at the S input of either flip-flop 20 or 22 will assert a logic low at the $\overline{Q}$ output on the condition that both R inputs of that flip-flop are low. From this discussion, it follows that if the latched data at the Q output of flip-flop 14 is high, R-S flip-flop 20 and associated NOR gate 24 are disabled while R-S flip-flop 22 and NOR gate 26 detect negative glitches. In a like manner, if the latched data at the Q output of flip-flop 14 is low, R-S flip-flop 22 and NOR gate 26 are disabled while R-S flip-flop 20 and NOR gate 24 detect positive glitches. A glitch is detected when, during a clock period, one of the complementary outputs of amplifier 12 goes through a low-to-high-to-low sequence. In the initial condition, the S and both R inputs of the enabled flip-flop 20 or 22 are low, the respective $\overline{Q}$ output is high, and the associated NOR gate output is low. On the low-to-high transition at the S input of the enabled flip-flop, the $\overline{Q}$ output goes low. The $\overline{Q}$ output remains low on the high-to-low transition, and so with both inputs of the associated NOR gate low, the NOR gate output goes high, producing a detector signal. This causes one of the R inputs of R-S flip-flop 30 to go high, asserting at high at the $\overline{Q}$ output of flip-flop 30. When the $\overline{Q}$ output of the second R-S flip-flop 30 goes high, a high is applied to the R input of the active first R-S flip-flop 20 or 22, forcing its $\overline{Q}$ output high and the R input of second R-S flip-flop 30 low. The $\overline{Q}$ output of R-S flip-flop 30 remains high until reset, providing a glitch-indication signal.

The glitch output circuit comprises a glitch latch D-type flip-flop 32, the Q output of which is connected to an output terminal 34. The logic state at the D input is transferred to the Q output upon receipt of a positive going clock edge. Therefore, a logic high, indicating the glitch, will remain at output terminal 34 for at least one full clock period.

The reset circuit comprises an AND gate 36 and a D-type flip-flop 38. In the initial no-glitch condition, the R input of flip-flop 38 is high, asserting a low at the Q output thereof. Upon detection of a glitch, R-S flip-flop 30 operates as hereinabove described, with the Q output thereof going low and the $\overline{Q}$ output going high. On the next positive-going clock edge, the high glitch data is transferred from the D input of flip-flop 32 to the Q output thereof. With both inputs of AND gate 36 high, reset flip-flop 38 receives a clock edge, transferring the high at the D input thereof to the Q output thereof. The reset flip-flop 38 Q output is connected to the second R-S flip-flop 30 S input, asserting a high at the Q output thereof, and, hence, at the R input of reset flip-flop 38. At the same time, the $\overline{Q}$ output of flip-flop 30 goes low, enabling the active first R-S flip-flop 20 or 22 for another clock period.

Figure 2:
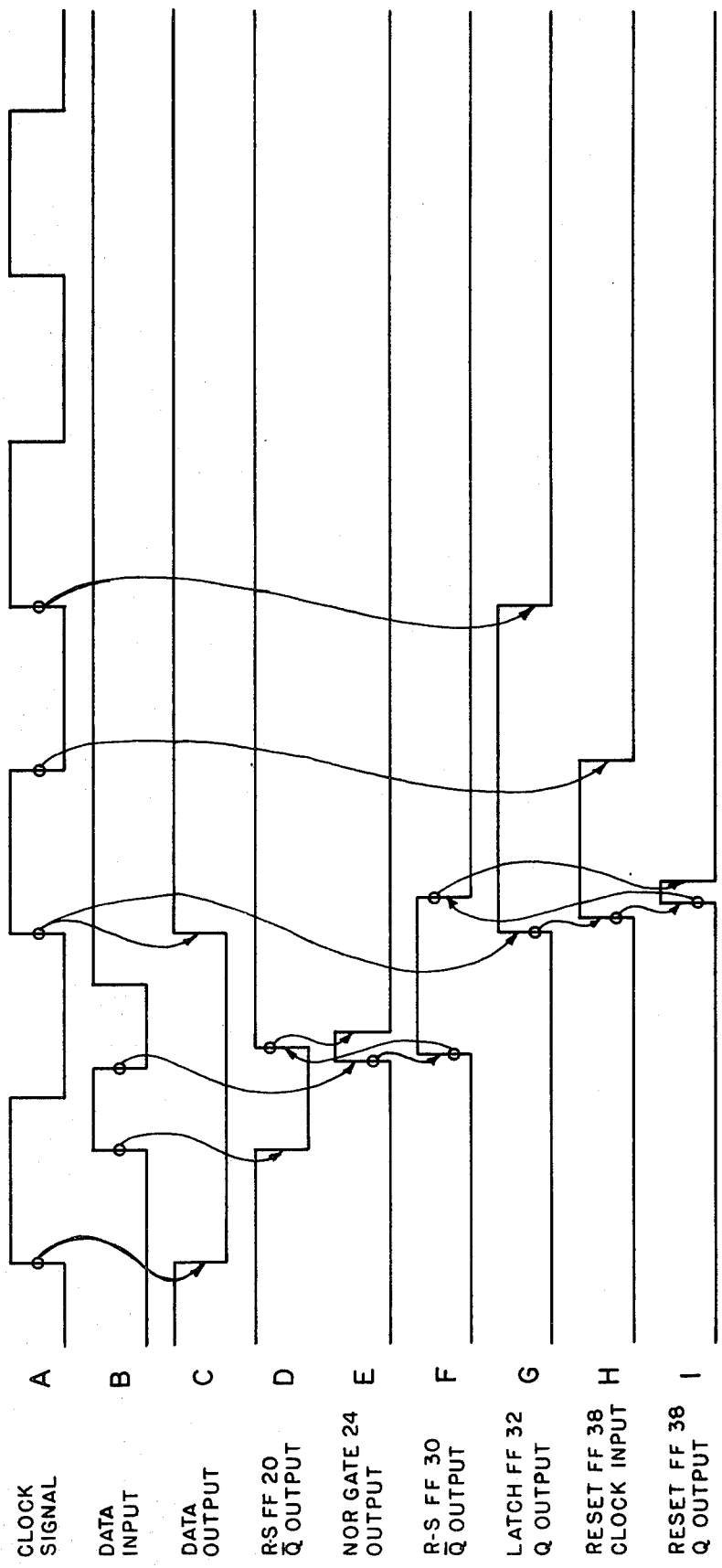
FIG. 2 is an exemplary waveform timing diagram to aid in understanding the circuit of FIG. 1.

To summarize the operation of the circuit of FIG. 1, reference is made to the exemplary waveform timing diagram of FIG. 2. Waveform reference points A through I are given in FIG. 1. For this example, we are assuming that the input data at point B is low. When the clock signal (point A) goes high, the data low is transferred to the Q output (point C) of the data latch flip-flop 14. A logic high is applied from the data latch flip-flop 14 $\overline{Q}$ output to one of the R inputs of R-S flip-flop 22. Thus, for this example, R-S flip-flop 22 is disabled so that R-S flip-flop 20 may detect positive glitches. Let us suppose such a positive-going glitch occurs. The voltage at point B, and, hence, the S input of R-S flip-flop 20, goes high, forcing the $\overline{Q}$ output (point D) of flip-flop 20 low. Note that if the data is merely changing states and is therefore not a glitch, there is no change at this time at point E, the input of flip-flop 30. However, suppose that the data voltage at point B goes low within the same clock period, defining a glitch. With both inputs of NOR gate 24 low, the output thereof (point E) goes high, causing the second R-S flip-flop 30 $\overline{Q}$ output (point F) to go high, resetting the first R-S flip-flop 20, in turn causing the $\overline{Q}$ output of flip-flop 20 at point D to go high and the output of NOR gate 24 (point E) to go low. With a glitch thus detected, the glitch detector will not respond to any further changes in the data input at point B during the remainder of the clock period. As a matter of consequence, therefore, signal aberrations involving three logic-state transitions, or second-order glitches, may be detected as easily as those having just two transitions, or first-order glitches.

The logic high at the $\overline{Q}$ output (point F) of the second R-S flip-flop 30 is transferred to the Q output of glitch latch flip-flop 32 (point G) on the next positive-going clock edge. The output of AND gate 36 (point H) goes high, toggling flip-flop 38 and causing its Q output (point I) to go high. The high at point I is applied to the S input of R-S flip-flop 30, causing its $\overline{Q}$ output (point F) to go low, releasing the first R-S flip-flops 20 and 22. At the same time, the Q output of second R-S flip-flop 30 goes high, resetting the reset flip-flop 38 and causing its Q output (point I) to go low. The glitch output at terminal 34 (point G) will remain high for one complete clock period; however, the glitch detection circuit is activated and is capable of detecting a glitch during that clock period. From the foregoing description, it can be seen that glitches may be detected during every clock cycle.

While there has been shown and described the preferred embodiment according to the present invention, it will be apparent to those skilled in the art that many changes and modifications may be made without departing from the invention in its broader aspects. It is therefore contemplated that the appended claims will not be construed in a limiting sense and will cover any such modifications or embodiments as fall within the true scope of the invention.

I claim as my invention:

1. A circuit for detecting two or more successive transitions of an input digital signal which occur within a clock period, comprising:
   first bistable circuit means for producing a changed logic state in response to the first of said two or more successive transitions of said input signal;
   means responsive to both said changed logic state and the second of said two or more successive transitions of said input signal for producing a detection signal; and
   second bistable circuit means responsive to said detection signal for producing a changed logic state indicating said detection.

2. A circuit in accordance with claim 1 further including means for providing the complement of said input signal, wherein said first bistable circuit means comprises a pair of flip-flops, one being responsive to said input signal and the other being responsive to the complement of said input signal.

3. A circuit in accordance with claim 2 further including means for providing a complementary control signal to enable one of said pair of flip-flops while disabling the other for said clock period, said control signal being derived from said input signal.

4. A circuit in accordance with claim 2 further including means for resetting said first and second bistable circuit means at the end of said clock period.

5. A circuit in accordance with claim 4 wherein said resetting means includes a flip-flop triggerable at the end of said clock period, the output of said flip-flop being connected to said second bistable circuit means to cause said second bistable means to revert from said changed logic state to a first bistable logic state.

6. In a sampled data acquisition system, a circuit for detecting glitches occurring within a sample clock period, comprising:
   signal input means including a data latch which is periodically updated under sample clock control with the logic state of the input signal;
   detector circuit means for producing a detection signal if two or more successive transitions of the input signal occur within the sample clock period, said detector circuit means comprising in combination a flip-flop and a logic gate; and glitch indication circuit means responsive to said detection signal for producing a glitch indication signal.

7. A glitch detector circuit in accordance with claim 6 wherein said detector circuit means further comprises a second combination of a flip-flop and a logic gate so that detection of both positive-going and negative-going glitches is facilitated.

8. A glitch detector circuit in accordance with claim 6 further including means for resetting said detector circuit means and said glitch indication circuit means such that glitch detection may be provided on every cycle of said sample clock.

* * * * *